United States Patent
Lin et al.

(10) Patent No.: US 11,599,600 B2
(45) Date of Patent: Mar. 7, 2023

(54) COMPUTING IN MEMORY CELL

(71) Applicant: Industrial Technology Research Institute, Hsinchu (TW)

(72) Inventors: Chih-Sheng Lin, Tainan (TW); Jian-Wei Su, Hsinchu (TW); Tuo-Hung Hou, Hsinchu (TW); Sih-Han Li, New Taipei (TW); Fu-Cheng Tsai, Tainan (TW); Yu-Hui Lin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 297 days.

(21) Appl. No.: 17/013,646

(22) Filed: Sep. 6, 2020

(65) Prior Publication Data
US 2021/0397675 A1    Dec. 23, 2021

(30) Foreign Application Priority Data

Jun. 22, 2020    (TW) .................................. 109121085

(51) Int. Cl.
*G11C 11/412*    (2006.01)
*G06F 17/16*    (2006.01)

(52) U.S. Cl.
CPC ............ *G06F 17/16* (2013.01); *G11C 11/412* (2013.01)

(58) Field of Classification Search
CPC ............ G06F 15/7839; G06F 15/7842; G06F 15/786; G11C 11/412; G11C 11/419;
(Continued)

(56) References Cited

U.S. PATENT DOCUMENTS 6,765,816 B2 *    7/2004    Pelley ................. G11C 7/1078
                                                          365/156
7,400,523 B2    7/2008    Houston
(Continued)

FOREIGN PATENT DOCUMENTS

| CN | 110163351 | 8/2019 |
| EP | 2600349   | 6/2013 |
| TW | I665614   | 7/2019 |

OTHER PUBLICATIONS

"Office Action of Taiwan Counterpart Application", dated Jan. 22, 2021, p. 1-p. 6.
Nagalingam Rajeswaran et al., "Ultra low voltage and low power Static Random Access Memory design using average 6.5T technique," Leonardo Electronic Journal of Practices and Technologies, vol. 14, No. 27, Jul. 2015, pp. 138-154.
(Continued)

*Primary Examiner* — Long Nguyen
(74) *Attorney, Agent, or Firm* — JCIPRNET (57) ABSTRACT

A computing in memory (CIM) cell includes a memory cell circuit, a first semiconductor element, a second semiconductor element, and a third semiconductor element. A first terminal of the first semiconductor element is coupled to a first computing bit-line. A control terminal of the first semiconductor element is coupled to a computing word-line. A control terminal of the second semiconductor element is coupled to the memory cell circuit. A first terminal of the second semiconductor element is coupled to a second terminal of the first semiconductor element. A first terminal of the third semiconductor element is coupled to a second terminal of the second semiconductor element. A second terminal of the third semiconductor element is coupled to a second computing bit-line. A control terminal of the third semiconductor element receives a bias voltage.

9 Claims, 6 Drawing Sheets

(58) Field of Classification Search
CPC ............... G11C 11/54; G11C 11/4085; G11C 11/4094; G11C 11/4097; G11C 7/1006; G11C 7/52; G06N 3/0635
See application file for complete search history.

(56) References Cited

U.S. PATENT DOCUMENTS

| | | |
|---|---|---|
| 8,693,237 B2 | 8/2014 | Jou et al. |
| 8,873,279 B2 | 10/2014 | Houston |
| 9,418,333 B2 | 8/2016 | Kim et al. |
| 9,490,008 B1 | 11/2016 | Moharir |
| 9,697,888 B1 | 7/2017 | Moharir |
| 10,381,071 B1 | 8/2019 | Si et al. |
| 2007/0279966 A1 | 12/2007 | Houston |
| 2021/0375362 A1* | 12/2021 | Yabuuchi ............... G11C 7/065 |

OTHER PUBLICATIONS

Akhilesh Jaiswal et al., "8T SRAM Cell as a Multibit Dot-Product Engine for Beyond Von Neumann Computing," IEEE Transactions on Very Large Scale Integration (VLSI) Systems, vol. 27, Issue 11, Nov. 2019, pp. 2556-2567.

Amogh Agrawal et al., "X-SRAM: Enabling In-Memory Boolean Computations in CMOS Static Random Access Memories," IEEE Transactions on Circuits and Systems I: Regular Papers, vol. 65, Issue 12, Dec. 2018, pp. 4219-4232.

Xin Si et al., "24.5 A Twin-8T SRAM Computation-In-Memory Macro for Multiple-Bit CNN-Based Machine Learning," 2019 IEEE International Solid-State Circuits Conference—(ISSCC), Feb. 17-21, 2019, pp. 1-3.

Bo Wang et al., "A 0.2V 16Kb 9T SRAM with bitline leakage equalization and CAM-assisted write performance boosting for improving energy efficiency," 2012 IEEE Asian Solid State Circuits Conference (A-SSCC), Nov. 12-14, 2012, pp. 73-76.

* cited by examiner

COMPUTING IN MEMORY CELL

CROSS-REFERENCE TO RELATED APPLICATION

This application claims the priority benefit of Taiwan application no. 109121085, filed on Jun. 22, 2020. The entirety of the above-mentioned patent application is hereby incorporated by reference herein and made a part of this specification.

TECHNICAL FIELD

The disclosure relates to a memory circuit, and more particularly, relates to a computing in memory cell.

BACKGROUND

Artificial intelligence (AI) networks, such as deep neural networks (DNN), are often required to perform a matrix multiplication. Matrix data is transmitted (moved) from a memory to a computing circuit for the matrix multiplication. In the computing process of the AI network, the movement of a large amount of data will consume time and energy. Computing in memory (CIM) technology can reduce the number of data movements. CIM technology has the advantages of increasing computing power and reducing power consumption.

SUMMARY

The disclosure provides a computing in memory (CIM) cell to realize computing in memory.

In an embodiment of the invention, the computing in memory cell includes a memory cell circuit, a first semiconductor element, a second semiconductor element, and a third semiconductor element. A first terminal of the first semiconductor element is adapted to be coupled to a first computing bit-line. A control terminal of the first semiconductor element is adapted to be coupled to a first computing word-line. A control terminal of the second semiconductor element is coupled to a first data node in the memory cell circuit. A first terminal of the second semiconductor element is coupled to a second terminal of the first semiconductor element. A third semiconductor element is configured to provide a first weight resistance corresponding to a first weight. A first terminal of the third semiconductor element is coupled to a second terminal of the second semiconductor element. A second terminal of the third semiconductor element is adapted to be coupled to a second computing bit-line. A control terminal of the third semiconductor element is adapted to receive a first bias voltage corresponding to the first weight.

In an embodiment of the invention, the computing in memory cell includes a memory cell circuit, a first semiconductor element, a second semiconductor element, a third semiconductor element, and a fourth semiconductor element. A first terminal of the first semiconductor element is adapted to receive a bias voltage corresponding to a first weight. A control terminal of the first semiconductor element is adapted to be coupled to a computing word-line. A control terminal of the second semiconductor element is coupled to a first data node in the memory cell circuit. A first terminal of the second semiconductor element is coupled to a second terminal of the first semiconductor element. A first terminal of the third semiconductor element is coupled to a second terminal of the second semiconductor element. A second terminal of the third semiconductor element is adapted to receive a reference voltage. A control terminal of the third semiconductor element is adapted to receive an inverted signal of the computing word-line. The fourth semiconductor element is configured to selectively provide a weight resistance corresponding to a weight. A first terminal of the fourth semiconductor element is adapted to be coupled to a first computing bit-line. A second terminal of the fourth semiconductor element is adapted to be coupled to a second computing bit-line. A control terminal of the fourth semiconductor element is coupled to the second terminal of the second semiconductor element.

Based on the above, the computing word-lines described in the embodiments of the invention can provide one data bit (a first data bit for control a first semiconductor element to be turned on/off) in one matrix, and the memory cell circuit can provide one data bit (a second data bit for controlling a second semiconductor element to be turned on/off) in another matrix. The operation of the first semiconductor element and the second semiconductor element is equivalent to a multiplication operation performed on the first data bit and the second data bit. As a result, the in-memory computing cell can realize in-memory computing.

To make the aforementioned more comprehensible, several embodiments accompanied with drawings are described in detail as follows.

DETAILED DESCRIPTION

The term "coupled (or connected)" used in this specification (including claims) may refer to any direct or indirect connection means. For example, "a first device is coupled (connected) to a second device" can be interpreted as "the first device is directly connected to the second device" or "the first device is indirectly connected to the second device through other devices or connection means". The terms such as "first", "second" and the like as recited in full text of the specification (including claims) are intended to give the elements names or distinguish different embodiments or scopes, and are not intended to limit an upper limit or a lower limit of the number of the elements nor limit an order of the elements. Moreover, wherever possible, elements/components/steps with same reference numerals represent same or similar parts in the drawings and embodiments. Elements/components/steps with the same reference numerals or names in different embodiments may be cross-referenced.

Figure 1:
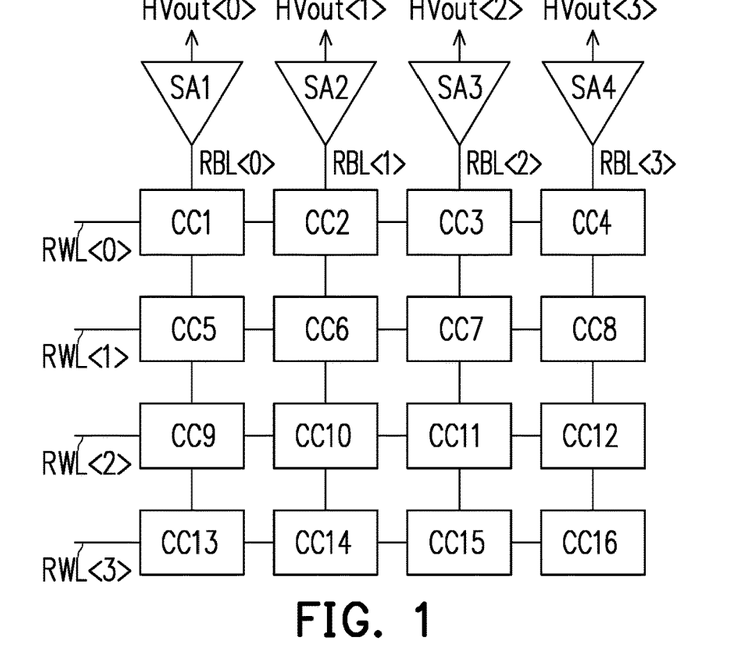
FIG. 1 is a circuit block diagram of a memory according to an embodiment of the disclosure.

FIG. 1 is a circuit block diagram of a memory according to an embodiment of the disclosure. According to design requirements, the memory may be a static random access memory (SRAM), a dynamic random access memory (DRAM), or other types of memories. The memory has a memory cell array. The memory cell array includes a plurality of computing in memory (CIM) cells. The number of the computing in memory cells in the memory cell array may be determined according to design requirements. For instance, the memory cell array shown by FIG. 1 includes computing in memory cells CC1, CC2, CC3, CC4, CC5, CC6, CC7, CC8, CC9, CC10, CC11, CC12, CC13, CC14, CC15, and CC16. Each of the computing in memory cells CC1 to CC16 can provide a general memory cell function. In addition, each of the computing in memory cells CC1 to CC16 can further provide a computing in memory (CIM) function.

A computing word-line RWL<0> is coupled to the computing in memory cells CC1, CC2, CC3, and CC4; a computing word-line RWL<1> is coupled to the computing in memory cells CC5, CC6, CC7, and CC8; a computing word-line RWL<2> is coupled to the computing in memory cells CC9, CC10, CC11, and CC12; and a computing word-line RWL<3> is coupled to the computing in memory cells CC13, CC14, CC15, and CC16. A computing bit-line RBL<0> is coupled to the computing in memory cells CC1, CC5, CC9, and CC13. A sense amplifier SA1 can sense a current of the computing bit-line RBL<0> and output a sensed result HVout<0>. A computing bit-line RBL<1> is coupled to the computing in memory cells CC2, CC6, CC10, and CC14. A sense amplifier SA2 can sense a current of the computing bit-line RBL<1> and output a sensed result HVout<1>. A computing bit-line RBL<2> is coupled to the computing in memory cells CC3, CC7, CC11, and CC15. A sense amplifier SA3 can sense a current of the computing bit-line RBL<2> and output a sensed result HVout<2>. A computing bit-line RBL<3> is coupled to the computing in memory cells CC4, CC8, CC12, and CC16. A sense amplifier SA4 can sense a current of the computing bit-line RBL<3> and output a sensed result HVout<3>.

The memory cell array shown by FIG. 1 can perform matrix multiplication, that is, calculate a matrix A times a matrix B. For example, the matrix B can be stored in the computing in memory cells CC1 to CC16, and the computing word-lines RWL<0> to RWL<3> can provide (transmit) elements (data bits) in a row of the matrix A. Each of the computing in memory cells CC1 to CC16 can perform a multiplication operation on one element (data bit) of the matrix A and one element (data bit) of the matrix B, and provide a resistance corresponding to a result of the multiplication operation (i.e., provide a corresponding current). The current of each of the computing bit-lines RBL<0> to RBL<3> is equivalent to a sum of the results of the multiplication operations of the corresponding computing in memory cells. In this way, the memory cell array shown by FIG. 1 can perform the matrix multiplication. The memory shown by FIG. 1 can realize the computing in memory.

Figure 2:
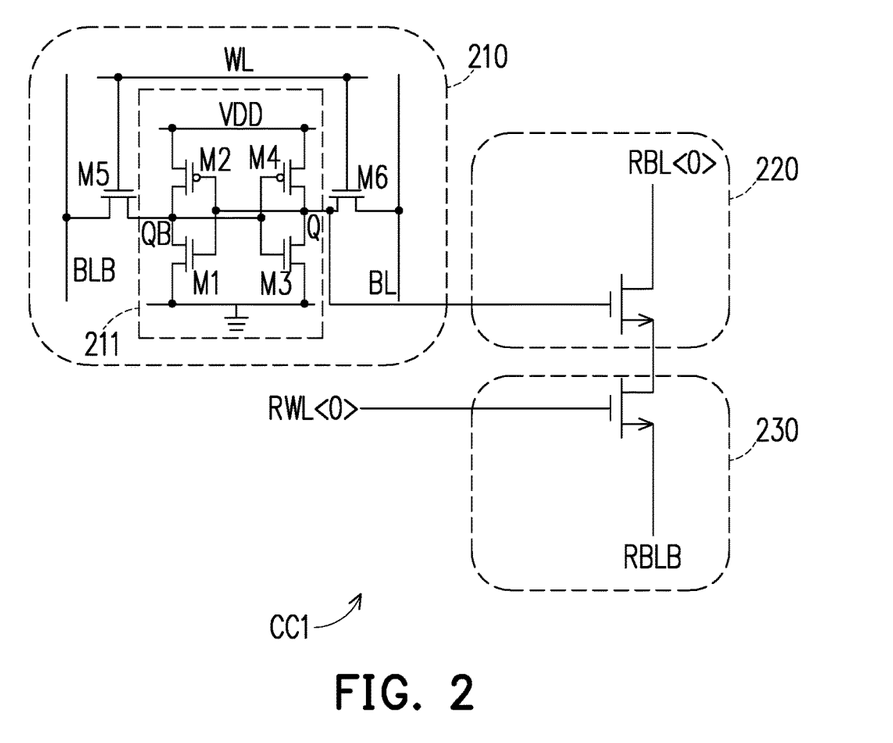
FIG. 2 is a circuit block diagram of a computing in memory cell CC1 shown by FIG. 1 according to an embodiment of the disclosure.

FIG. 2 is a circuit block diagram of a computing in memory cell CC1 shown by FIG. 1 according to an embodiment of the disclosure. The other computing in memory cells CC2 to CC16 shown by FIG. 1 can be inferred by referring to the relevant description of the computing in memory cell CC1, which is not repeated hereinafter. In the embodiment shown by FIG. 2, the computing in memory cell CC1 includes a memory cell circuit 210, a semiconductor element 220, and a semiconductor element 230. This embodiment does not limit the implementation of the memory cell circuit 210. According to design requirements, in other embodiments, the memory cell circuit 210 may include memory cells of the SRAM, the memory cells of the DRAM, or other types of memory cells.

In the embodiment shown by FIG. 2, the memory cell circuit 210 includes a static random access memory cell 211, a switch M5, and a switch M6. The static random access memory cell 211 has a data node Q and a data node QB. A first terminal of the switch M6 is coupled to the data node Q, a second terminal of the switch M6 is adapted to be coupled to a data bit-line BL, and a control terminal of the switch M6 is adapted to be coupled to a data word-line WL. A first terminal of the switch M5 is coupled to the data node QB, a second terminal of the switch M5 is adapted to be coupled to a data bit-line BLB, and a control terminal of the switch M5 is adapted to be coupled to the data word-line WL.

In the embodiment shown by FIG. 2, the static random access memory cell 211 includes a transistor M1, a transistor M2, a transistor M3, and a transistor M4. The transistors M1 and M3 may be N-channel metal oxide semiconductor (NMOS) transistors. The transistors M2 and M4 may be P-channel metal oxide semiconductor (PMOS) transistors. A control terminal (e.g., gate) of the transistor M1 is coupled to the data node Q, a first terminal (e.g., drain) of the transistor M1 is coupled to the data node QB, and a second terminal (e.g., source) of the transistor M1 is adapted to receive a reference voltage (e.g., a ground voltage or other fix voltages). A control terminal (e.g., gate) of the transistor M2 is coupled to the data node Q, a first terminal (e.g., drain) of the transistor M2 is coupled to the data node QB, and a second terminal (e.g., source) of the transistor M2 is adapted to receive a system voltage VDD. A control terminal (e.g., gate) of the transistor M3 is coupled to the data node QB, a first terminal (e.g., drain) of the transistor M3 is coupled to the data node Q, and a second terminal (e.g., source) of the transistor M3 is adapted to receive the reference voltage (e.g., the ground voltage or other fix voltages). A control terminal (e.g., gate) of the transistor M4 is coupled to the data node QB, a first terminal (e.g., drain) of the transistor M4 is coupled to the data node Q, and a second terminal (e.g., source) of the transistor M4 is adapted to receive the system voltage VDD.

According to design requirements, the semiconductor element 220 and (or) the semiconductor element 230 may be composed of NMOS transistors, PMOS transistors, or other types of transistors. A first terminal of the semiconductor element 220 is adapted to be coupled to the computing bit-line RBL<0>. The sense amplifier SA1 can serve as a voltage source of the computing bit-line RBL<0>. A control terminal of the semiconductor element 220 is coupled to the data node Q in the memory cell circuit 210. A first terminal of the semiconductor element 230 is coupled to a second terminal of the semiconductor element 220, and a second terminal of the semiconductor element 230 is adapted to be coupled to a computing bit-line RBLB. According to design requirements, the computing bit-line RBLB can be coupled to a voltage source (not shown) to receive the reference voltage. For instance, the second terminal of the semiconductor element 230 can receive the ground voltage (or other reference voltage) through the computing bit-line RBLB. A control terminal of the semiconductor element 230 is adapted to be coupled to the computing word-line RWL<0>.

Figure 3:
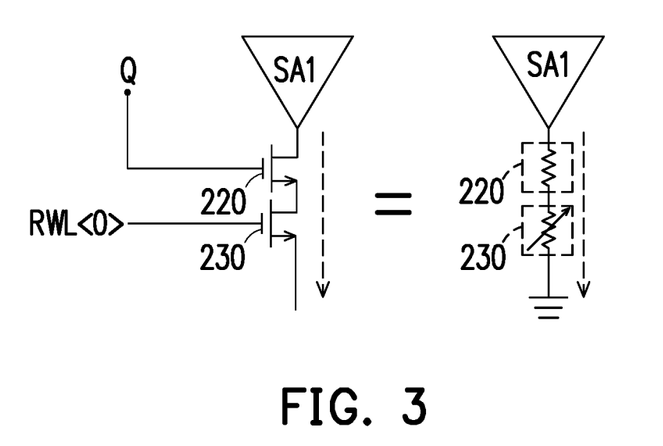
FIG. 3 is an equivalent circuit diagram of semiconductor elements shown by FIG. 2 according to an embodiment of the disclosure.

FIG. 3 is an equivalent circuit diagram of the semiconductor elements 220 and 230 shown by FIG. 2 according to an embodiment of the disclosure. When the computing word-line RWL<0> is at logic "1", a voltage of the computing word-line RWL<0> is a bias voltage corresponding a weight. Here, a voltage difference between the bias voltage and a voltage of the computing bit-line RBLB is less than a threshold voltage of the semiconductor element 230. The weight and the bias voltage may be determined according to design requirements. Therefore, when the computing word-line RWL<0> is at logic "1", the semiconductor element 230 can provide a weight resistance corresponding to the weight. Based on the setting of the bias voltage, the weight resistance may be determined according to design requirements. When the computing word-line RWL<0> is at logic "0", the voltage of the computing word-line RWL<0> may be the ground voltage or a voltage sufficient to turn off the semiconductor element 230. Therefore, when the computing word-line RWL<0> is at logic "0", the semiconductor element 230 is turned off (i.e., the resistance of the semiconductor element 230 is ideally infinite).

The sense amplifier SA1 can provide a voltage (or a current) to the computing bit-line RBL<0>. When the data node Q in the memory cell circuit 210 is at logic "1" (e.g., high logic level), the semiconductor element 220 is turned on (i.e., the resistance of the semiconductor element 220 is very small). In the case where the computing word-line RWL<0> is at logic 1", the currents of the semiconductor elements 220 and 230 are mainly determined by the weight resistance of the semiconductor element 230 (because the weight resistance of the semiconductor element 230 is far greater than a turn-on resistance of the semiconductor element 220). Moreover, it is also possible that the weight resistance of the semiconductor element 230 is far greater than a parasitic resistance on an electrical path so the weight resistance of the semiconductor element 230 can dominate the current on the electrical path in such a case. When the data node Q in the memory cell circuit 210 is at logic "0" (e.g., low logic level), the semiconductor element 220 is turned off (i.e., the resistance of the semiconductor element 220 is ideally infinite). Therefore, the semiconductor elements 220 and 230 have no current (considering the actual leakage, the currents of the semiconductor elements 220 and 230 are currents close to 0).

In terms of operation of the semiconductor elements 220 and 230, the semiconductor elements 220 and 230 will have the currents (at logic "1") only when the data node Q is at logic "1" and the computing word-line RWL<0> is also at logic "1". Such operation is equivalent to a multiplication operation performed on logic "1" of the data node Q and logic "1" of the computing word-line RWL<0>, i.e., 1*1=1.

Figure 4:
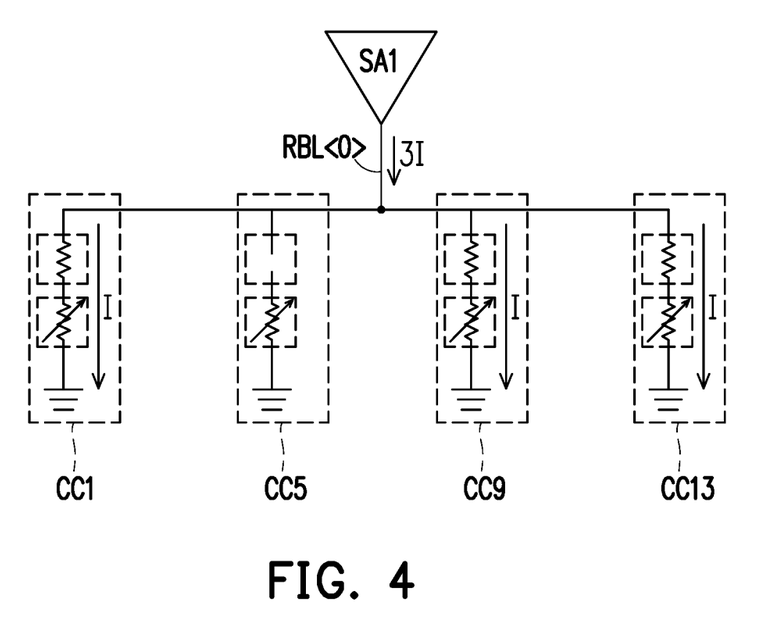
FIG. 4 is an equivalent circuit diagram of the computing in memory cells shown by FIG. 1 according to an embodiment of the disclosure.

FIG. 4 is an equivalent circuit diagram of the computing in memory cells CC1, CC5, CC9, and CC13 shown by FIG. 1 according to an embodiment of the disclosure. The computing in memory cells CC1, CC5, CC9, and CC13 shown by FIG. 4 can be inferred by referring to the relevant description of FIG. 2 and FIG. 3. In the scenario shown by FIG. 4, the data nodes Q of the computing in memory cells CC1, CC5, CC9, and CC13 are at logic "1", "0", "1", and "1", respectively, and the computing word-lines RWL<0>, RWL<1>, RWL<2>, and RWL<3> of the computing in memory cells CC1, CC5, CC9, and CC13 are all at logic "1". It is assumed here that based on the setting of the bias voltages of RWL<0>, RWL<1>, RWL<2>, and RWL<3>, the currents of the computing in memory cells CC1, CC9, and CC13 are I. The sense amplifier SA1 can sense that the current of the computing bit-line RBL<0> is 3*I. Such operation is equivalent to a matrix multiplication operation perform on a row of elements (data bits) [1 0 1 1] of the matrix A and a column of elements (data bits) [1 1 1 1] of the matrix B to generate a matrix multiplication operation result of 1*1+0*1+1*1+1*1=3 (i.e., the current is 3*I).

Figure 5:
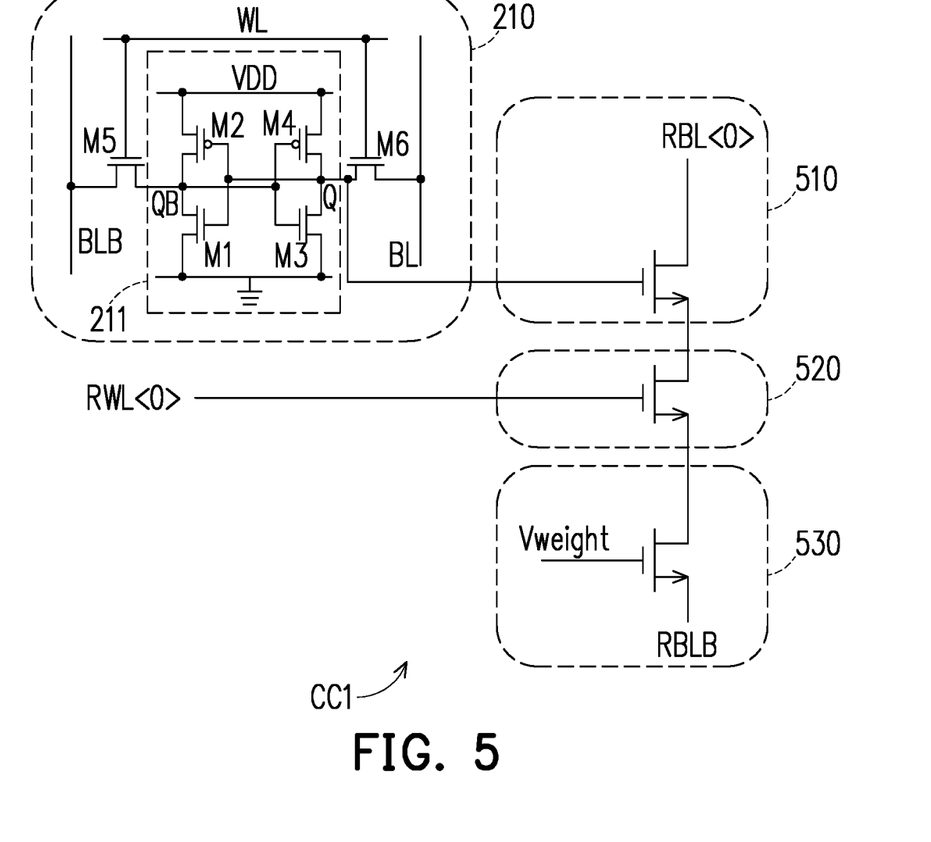
FIG. 5 is a circuit block diagram of the computing in memory cell shown by FIG. 1 according to another embodiment of the disclosure.

FIG. 5 is a circuit block diagram of the computing in memory cell CC1 shown by FIG. 1 according to another embodiment of the disclosure. The other computing in memory cells CC2 to CC16 shown by FIG. 1 can be inferred by referring to the relevant description of the computing in memory cell CC1, which is not repeated hereinafter. In the embodiment shown by FIG. 5, the computing in memory cell CC1 includes a memory cell circuit 210, a semiconductor element 510, a semiconductor element 520, and a semiconductor element 530. The memory cell circuit 210 shown by FIG. 5 can be inferred by referring to the relevant description of the memory cell circuit 210 shown by FIG. 2, which is not repeated hereinafter.

Referring to FIG. 5, the semiconductor element 510, the semiconductor element 520, and (or) the semiconductor element 530 may be composed of NMOS transistors, PMOS transistors, or other types of transistors. A first terminal of the semiconductor element 510 is adapted to be coupled to the computing bit-line RBL<0>. The sense amplifier SA1 can serve as a voltage source of the computing bit-line RBL<0>. A control terminal of the semiconductor element 510 is coupled to the data node Q in the memory cell circuit 210. A first terminal of the semiconductor element 520 is coupled to a second terminal of the semiconductor element 510, and a control terminal of the semiconductor element 520 is adapted to be coupled to the computing word-line RWL<0>. A first terminal of the semiconductor element 530 is coupled to a second terminal of the semiconductor element 520, and a second terminal of the semiconductor element 530 is adapted to be coupled to a computing bit-line RBLB. According to design requirements, the computing bit-line RBLB can be coupled to a voltage source (not shown) to receive the reference voltage. For instance, the second terminal of the semiconductor element 530 can receive the ground voltage (or other reference voltage) through the computing bit-line RBLB. A control terminal of the semiconductor element 530 is adapted to receive a bias voltage Vweight corresponding to a weight. The weight and the bias voltage Vweight may be determined according to design requirements. A voltage difference between the bias voltage Vweight of the control terminal of the semiconductor element 530 and a voltage of the computing bit-line RBLB is less than a threshold voltage of the semiconductor element 530.

Figure 6:
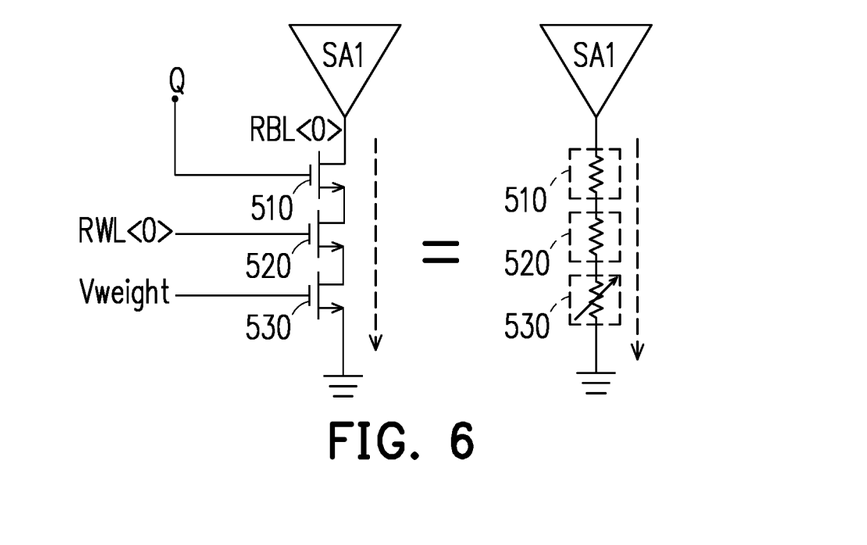
FIG. 6 is an equivalent circuit diagram of semiconductor elements shown by FIG. 5 according to an embodiment of the disclosure.

FIG. 6 is an equivalent circuit diagram of the semiconductor elements 510, 520, and 530 shown by FIG. 5 according to an embodiment of the disclosure. When the computing word-line RWL<0> is at logic "1" (e.g., high logic level), the semiconductor element 520 is turned on (i.e., the resistance of the semiconductor element 520 is very small).

When the computing word-line RWL<0> is at logic "0" (e.g., low logic level), the semiconductor element 520 is turned off (i.e., the resistance of the semiconductor element 520 is ideally infinite). When the data node Q in the memory cell circuit 210 is at logic "1" (e.g., high logic level), the semiconductor element 510 is turned on (i.e., the resistance of the semiconductor element 510 is very small). When the data node Q in the memory cell circuit 210 is at logic "0" (e.g., low logic level), the semiconductor element 510 is turned off (i.e., the resistance of the semiconductor element 510 is ideally infinite).

The sense amplifier SA1 can provide a voltage (or a current) to the computing bit-line RBL<0>. In the case where both the semiconductor elements 510 and 520 are turned on, the semiconductor element 530 can provide a weight resistance corresponding to the weight. Based on the setting of the bias voltage Vweight, the weight resistance may be determined according to design requirements. In the case where the semiconductor elements 510 and 520 are both turned on, the currents of the semiconductor elements 510 and 520 are mainly determined by the weight resistance of the semiconductor element 530 (because the weight resistance of the semiconductor element 530 is far greater than turn-on resistances of the semiconductor elements 510 and 520). Moreover, it is also possible that the weight resistance of the semiconductor element 530 is far greater than a parasitic resistance on an electrical path so the weight resistance of the semiconductor element 530 can dominate the current on the electrical path in such a case. In the case where the semiconductor elements 510 and (or) 520 are turned off, the semiconductor elements 510 and 520 have no current (considering the actual leakage, the currents of the semiconductor elements 510 and 520 are currents close to 0).

In terms of operation of the semiconductor elements 510 and 520, the semiconductor elements 510 and 520 will have the currents (at logic "1") only when the data node Q is at logic "1" and the computing word-line RWL<0> is also at logic "1". Such operation is equivalent to a multiplication operation performed on logic "1" of the data node Q and logic "1" of the computing word-line RWL<0>, i.e., 1*1=1.

Based on the description of FIG. 6, the computing in memory cells CC1, CC5, CC9, and CC13 can perform matrix multiplication operations. That is, the relevant description of FIG. 4 can also be analogized to the embodiments shown by FIG. 5 and FIG. 6. It is assumed that the data nodes Q of the computing in memory cells CC1, CC5, CC9, and CC13 are at logic "1", "0", "1", and "1", respectively, and the computing word-lines RWL<0>, RWL<1>, RWL<2>, and RWL<3> of the computing in memory cells CC1, CC5, CC9, and CC13 are at logic "1", "1", "0", and "1", respectively. Therefore, the currents of the computing in memory cells CC1 and CC13 are I. The sense amplifier SA1 can sense that the current of the computing bit-line RBL<0> is 2*I. Such operation is equivalent to a matrix multiplication operation perform on a row of elements (data bits) [1 0 1 1] of the matrix A and a column of elements (data bits) [1 1 0 1] of the matrix B to generate a matrix multiplication operation result of 1*1+0*1+1*0+1*1=2 (i.e., the current is 2*I).

Figure 7:
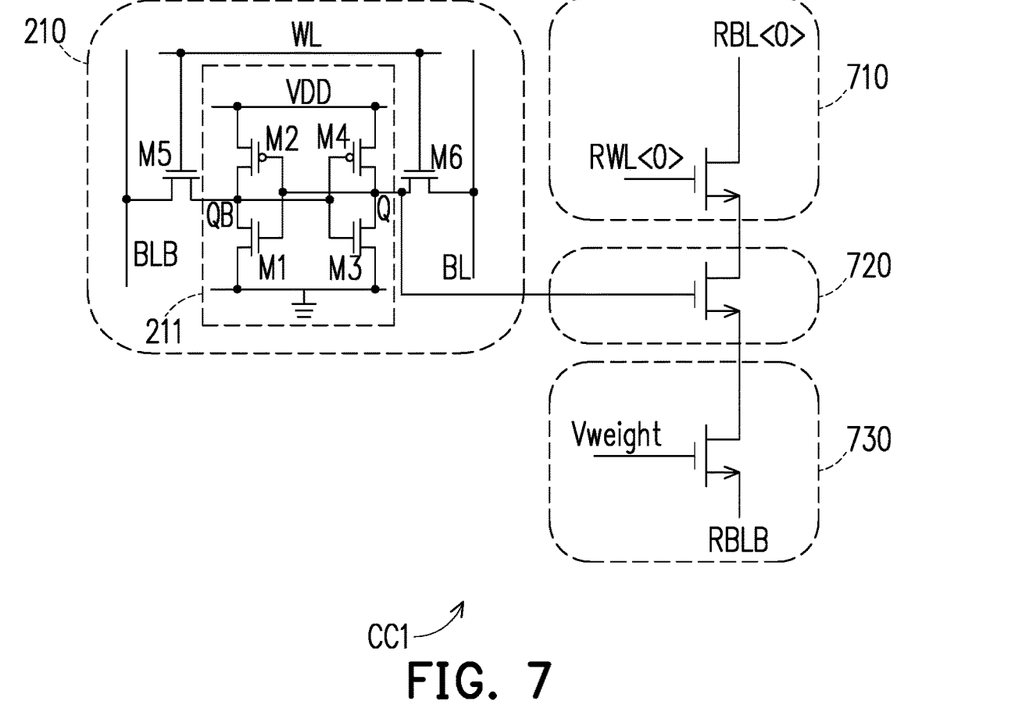
FIG. 7 is a circuit block diagram of the computing in memory cell shown by FIG. 1 according to yet another embodiment of the disclosure.

FIG. 7 is a circuit block diagram of the computing in memory cell CC1 shown by FIG. 1 according to yet another embodiment of the disclosure. The other computing in memory cells CC2 to CC16 shown by FIG. 1 can be inferred by referring to the relevant description of the computing in memory cell CC1, which is not repeated hereinafter. In the embodiment shown by FIG. 7, the computing in memory cell CC1 includes a memory cell circuit 210, a semiconductor element 710, a semiconductor element 720, and a semiconductor element 730. The memory cell circuit 210 shown by FIG. 7 can be inferred by referring to the relevant description of the memory cell circuit 210 shown by FIG. 2, which is not repeated hereinafter.

Referring to FIG. 7, the semiconductor element 710, the semiconductor element 720, and (or) the semiconductor element 730 may be composed of NMOS transistors, PMOS transistors, or other types of transistors. A first terminal of the semiconductor element 710 is adapted to be coupled to the computing bit-line RBL<0>. The sense amplifier SA1 can serve as a voltage source of the computing bit-line RBL<0>. A control terminal of the semiconductor element 710 is adapted to be coupled to the computing word-line RWL<0>. The semiconductor element 710 shown by FIG. 7 can be analogized with reference to the related description of the semiconductor element 520 shown by FIG. 5. A first terminal of the semiconductor element 720 is coupled to a second terminal of the semiconductor element 710. A control terminal of the semiconductor element 720 is coupled to the data node Q in the memory cell circuit 210. The semiconductor element 720 shown by FIG. 7 can be analogized with reference to the related description of the semiconductor element 510 shown by FIG. 5.

A first terminal of the semiconductor element 730 is coupled to a second terminal of the semiconductor element 720. A second terminal of the semiconductor element 730 is adapted to be coupled to the computing bit-line RBLB. According to design requirements, the computing bit-line RBLB can be coupled to a voltage source (not shown) to receive the reference voltage. For instance, the second terminal of the semiconductor element 730 can receive the ground voltage (or other reference voltage) through the computing bit-line RBLB. A control terminal of the semiconductor element 730 is adapted to receive a bias voltage Vweight corresponding to a weight. The weight and the bias voltage Vweight may be determined according to design requirements. A voltage difference between the bias voltage Vweight of the control terminal of the semiconductor element 730 and a voltage of the computing bit-line RBLB is less than a threshold voltage of the semiconductor element 730. The semiconductor element 730 shown by FIG. 7 can be analogized with reference to the related description of the semiconductor element 530 shown by FIG. 5.

The sense amplifier SA1 can provide a voltage (or a current) to the computing bit-line RBL<0>. In the case where both the semiconductor elements 710 and 720 are turned on, the semiconductor element 730 can provide a weight resistance corresponding to the weight. Based on the setting of the bias voltage Vweight, the weight resistance may be determined according to design requirements. In the case where the semiconductor elements 710 and 720 are both turned on, the currents of the semiconductor elements 710 and 720 are mainly determined by the weight resistance of the semiconductor element 730 (because the weight resistance of the semiconductor element 730 is far greater than turn-on resistances of the semiconductor elements 710 and 720). Moreover, it is also possible that the weight resistance of the semiconductor element 730 is far greater than a parasitic resistance on an electrical path so the weight resistance of the semiconductor element 730 can dominate the current on the electrical path in such a case. In the case where the semiconductor elements 710 and (or) 720 are turned off, the semiconductor elements 710 and 720 have no current (considering the actual leakage, the currents of the semiconductor elements 710 and 720 are currents close to 0).

In terms of operation of the semiconductor elements 710 and 720, the semiconductor elements 710 and 720 will have the currents (at logic "1") only when the data node Q is at logic "1" and the computing word-line RWL<0> is also at logic "1". Such operation is equivalent to a multiplication operation performed on logic "1" of the data node Q and logic "1" of the computing word-line RWL<0>, i.e., 1*1=1.

Figure 8:
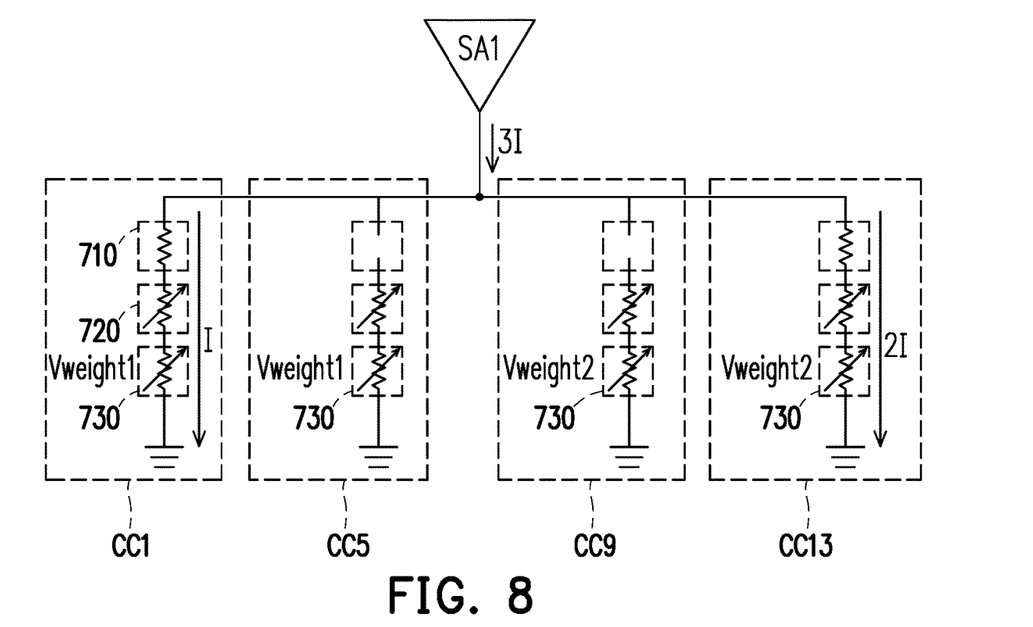
FIG. 8 is an equivalent circuit diagram of the computing in memory cell shown by FIG. 1 according to another embodiment of the disclosure.

FIG. 8 is an equivalent circuit diagram of the computing in memory cells CC1, CC5, CC9, and CC13 shown by FIG. 1 according to another embodiment of the disclosure. The computing in memory cells CC1, CC5, CC9, and CC13 shown by FIG. 8 can be inferred by referring to the relevant description of FIG. 7. In the scenario shown by FIG. 8, the computing word-lines RWL<0>, RWL<1>, RWL<2>, and RWL<3> of the computing in memory cells CC1, CC5, CC9, and CC13 are at logic "1", "0", "0", and "1", respectively, and the data nodes Q of the computing in memory cells CC1, CC5, CC9, and CC13 are at logic "1", "0", "1", and "1", respectively. It is assumed here that the bias voltages Vweight of the computing in memory cells CC1 and CC5 are set to bias voltages Vweight1 so that the current of the computing in memory cell CC1 is I. It is assumed here that the bias voltages Vweight of the computing in memory cells CC9 and CC13 are set to bias voltages Vweight2 so that the current of the computing in memory cell CC13 is 2*I. That is, in the case where the weights of the computing in memory cells CC1 and CC5 are 1, the weights of the computing in memory cells CC9 and CC13 are 2. The sense amplifier SA1 can sense that the current of the computing bit-line RBL<0> is 3*I. Such operation is equivalent to a matrix multiplication operation perform on a row of elements (data bits) [1 0 0 1] of the matrix A and a column of elements (data bits) [1 1 1 1] of the matrix B to generate a matrix multiplication operation result of 1*1*1 +0*1*1+ 0*1*2+1*1*2=1+0+0+2=3 (i.e., the current is 3*I).

Figure 9:
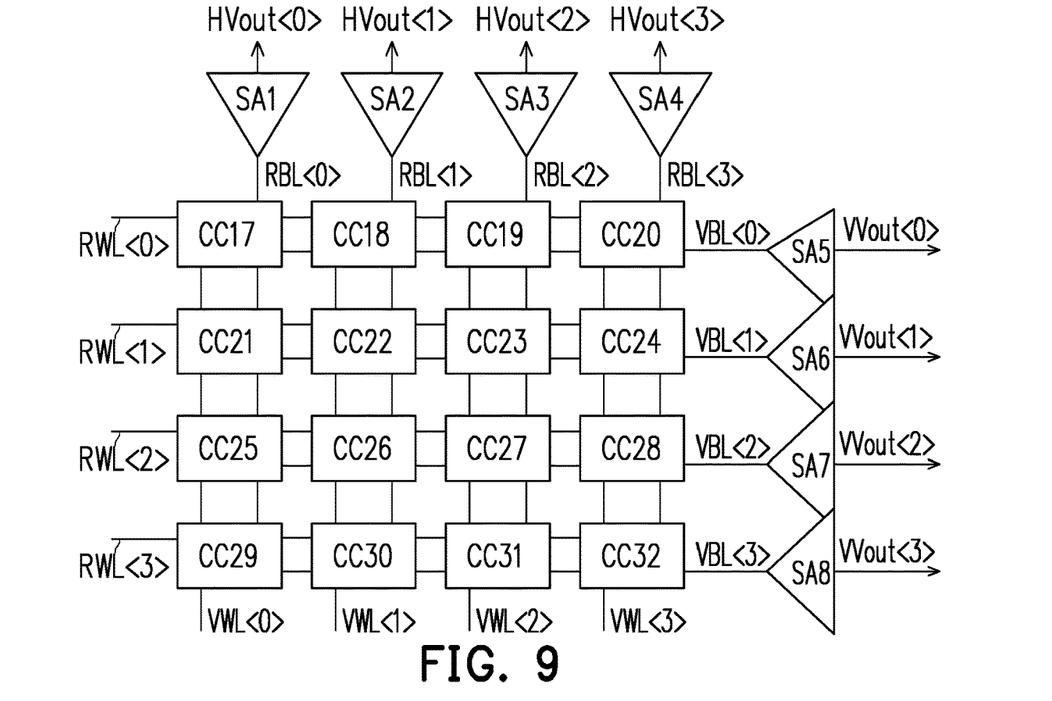
FIG. 9 is a circuit block diagram of a memory according to another embodiment of the disclosure.

FIG. 9 is a circuit block diagram of a memory according to another embodiment of the disclosure. According to design requirements, the memory shown by FIG. 9 may be the SRAM, the DRAM, or other types of memories. The memory shown by FIG. 9 has a memory cell array. The memory cell array includes a plurality of computing in memory (CIM) cells. The number of the computing in memory cells in the memory cell array may be determined according to design requirements. For instance, the memory cell array shown by FIG. 9 includes computing in memory cells CC17, CC18, CC19, CC20, CC21, CC22, CC23, CC24, CC25, CC26, CC27, CC28, CC29, CC30, CC31, and CC32. Each of the computing in memory cells CC17 to CC32 can provide a general memory cell function. In addition, each of the computing in memory cells CC17 to CC32 can further provide a computing in memory (CIM) function. In the embodiment shown by FIG. 9, a direction of the computing bit-lines RBL<0> to RBL<3> is different from a direction of computing bit-lines VBL<0> to VBL<3>. Further, in the embodiment shown by FIG. 9, a direction of the computing word-lines RWL<0> to RWL<3> is different from a direction of computing word-lines VWL<0> to VWL<3>.

The computing bit-line RBL<0> and the computing word-line VWL<0> are coupled to the computing in memory cells CC17, CC21, CC25, and CC29. A sense amplifier SA1 can sense a current of the computing bit-line RBL<0> and output a sensed result HVout<0>. The computing bit-line RBL<1> and the computing word-line VWL<1> are coupled to the computing in memory cells CC18, CC22, CC26, and CC30. A sense amplifier SA2 can sense a current of the computing bit-line RBL<1> and output a sensed result HVout<1>. The computing bit-line RBL<2> and the computing word-line VWL<2> are coupled to the computing in memory cells CC19, CC23, CC27, and CC31. A sense amplifier SA3 can sense a current of the computing bit-line RBL<2> and output a sensed result HVout<2>. The computing bit-line RBL<3> and the computing word-line VWL<3> are coupled to the computing in memory cells CC20 CC24, CC28, and CC32. A sense amplifier SA4 can sense a current of the computing bit-line RBL<3> and output a sensed result HVout<3>.

The computing word-line RWL<0> and the computing bit-line VBL<0> are coupled to the computing in memory cells CC17, CC18, CC19, and CC20. A sense amplifier SA5 can sense a current of the computing bit-line VBL<0> and output a sensed result VVout<0>. The computing word-line RWL<1> and the computing bit-line VBL<1> are coupled to the computing in memory cells CC21, CC22, CC23, and CC24. A sense amplifier SA6 can sense a current of the computing bit-line VBL<1> and output a sensed result VVout<1>. The computing word-line RWL<2> and the computing bit-line VBL<2> are coupled to the computing in memory cells CC25, CC26, CC27, and CC28. A sense amplifier SA7 can sense a current of the computing bit-line VBL<2> and output a sensed result VVout<2>. The computing word-line RWL<3> and the computing bit-line VBL<3> are coupled to the computing in memory cells CC29, CC30, CC31, and CC32. A sense amplifier SA8 can sense a current of the computing bit-line VBL<3> and output a sensed result VVout<3>.

The memory cell array shown by FIG. 9 can perform matrix multiplication, that is, calculate a matrix A times a matrix B. For example, the matrix B can be stored in the computing in memory cells CC17 to CC32, and the computing word-lines RWL<0> to RWL<3> can provide (transmit) elements (data bits) in a row of the matrix A. Each of the computing in memory cells CC17 to CC32 can perform a multiplication operation on one element (data bit) of the matrix A and one element (data bit) of the matrix B, and provide a resistance corresponding to a result of the multiplication operation (i.e., provide a corresponding current). The current of each of the computing bit-lines RBL<0> to RBL<3> is equivalent to a sum of the results of the multiplication operations of the corresponding computing in memory cells. In this way, the memory cell array shown by FIG. 9 can perform the matrix multiplication. The memory shown by FIG. 9 can realize the computing in memory.

The memory cell array shown by FIG. 9 may further calculate the matrix A times a transpose matrix BT. Here, the transpose matrix BT is a transpose of the matrix B. For example, the matrix B can be stored in the computing in memory cells CC17 to CC32, and the computing word-lines VWL<0> to VWL<3> can provide (transmit) elements (data bits) in a row of the matrix A. The current of each of the computing bit-lines VBL<0> to VBL<3> is equivalent to a sum of the results of the multiplication operations of the corresponding computing in memory cells. Regardless of whether "the matrix A times matrix B" or "the matrix A times the transpose matrix BT" is to be performed, the matrix B stored in memory cells CC17 to CC32 does not need to be transposed. Therefore, the memory shown in FIG. 9 can avoid the movement of data as much as possible.

Figure 10:
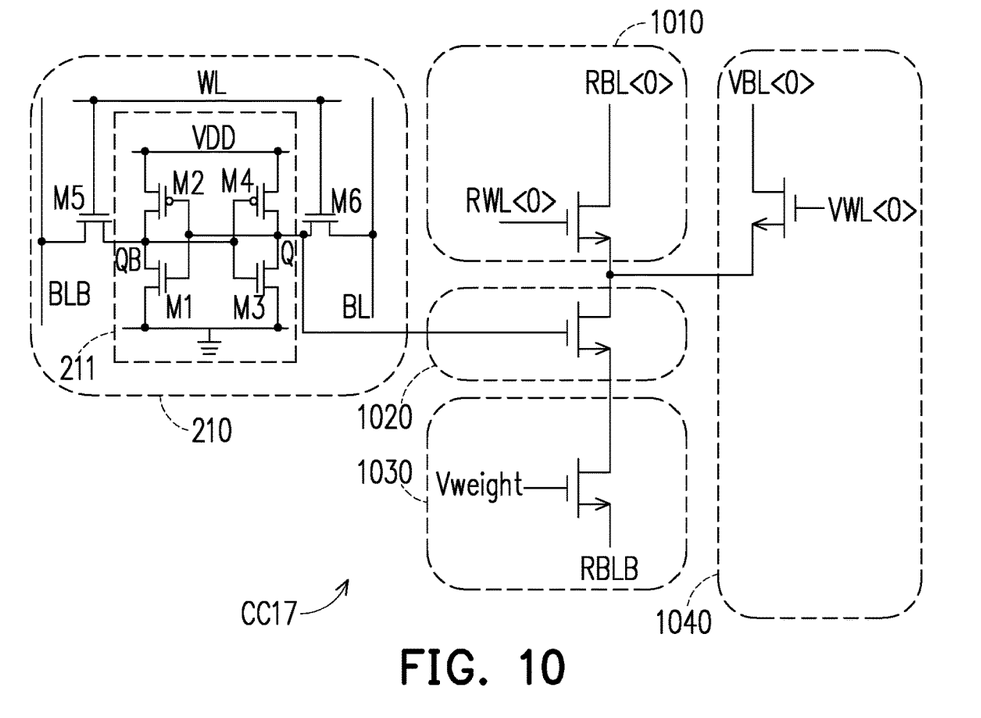
FIG. 10 is a circuit block diagram of a computing in memory cell shown by FIG. 9 according to another embodiment of the disclosure.

FIG. 10 is a circuit block diagram of a computing in memory cell CC17 shown by FIG. 9 according to an embodiment of the disclosure. The other computing in memory cells CC18 to CC32 shown by FIG. 9 can be inferred by referring to the relevant description of the computing in memory cell CC17, which is not repeated hereinafter. In the embodiment shown by FIG. 10, the computing in memory cell CC17 includes a memory cell circuit 210, a semiconductor element 1010, a semiconductor element 1020, a semiconductor element 1030, and a semiconductor element 1040. The memory cell circuit 210 shown by FIG. 10 can be inferred by referring to the relevant description of the memory cell circuit 210 shown by FIG. 2, which is not repeated hereinafter.

Referring to FIG. 10, the semiconductor element 1010, the semiconductor element 1020, the semiconductor element 1020, and (or) the semiconductor element 1040 may be composed of NMOS transistors, PMOS transistors, or other types of transistors. The semiconductor element 1010, the semiconductor element 1020, and the semiconductor element 1030 shown by FIG. 10 may be inferred by referring to the relevant description of the semiconductor element 710, the semiconductor element 720, and the semiconductor element 730 sown by FIG. 7, which is not repeated hereinafter.

A first terminal of the semiconductor element 1040 shown by FIG. 10 is adapted to be coupled to the computing bit-line VBL<0>. A second terminal of the semiconductor element 1040 is coupled to a first terminal of the semiconductor element 1020. A control terminal of the semiconductor element 1040 is adapted to be coupled to the computing word-line VWL<0>. Here, it is assumed that one element (data bit) of the matrix B is stored in the memory cell circuit 210 of computing in memory cell CC17. When "the matrix A times the matrix B" is to be performed, the semiconductor element 1040 can be disabled (or turned off). The computing word-line RWL<0> can provide (transmit) one element (a first data bit) of the matrix A to the control terminal of the semiconductor element 1010, and the memory cell circuit 210 can provide one element (a second data bit) of the matrix B to the control terminal of the semiconductor element 1020. Accordingly, the computing in memory cell CC17 can perform a multiplication operation on the first data bit and the second data bit and present a multiplication operation result (current) on the computing bit-line RBL<0>.

When "the matrix A times the transpose matrix BT" is to be performed, the semiconductor element 1010 can be disabled (turned off). The computing word-line VWL<0> can provide (transmit) one element (a first data bit) of the matrix A to the control terminal of the semiconductor element 1040, and the memory cell circuit 210 can provide one element (a second data bit) of the matrix B to the control terminal of the semiconductor element 1020. Accordingly, the computing in memory cell CC17 can perform a multiplication operation on the first data bit and the second data bit and present a multiplication operation result (current) on the computing bit-line VBL<0>.

Figure 11:
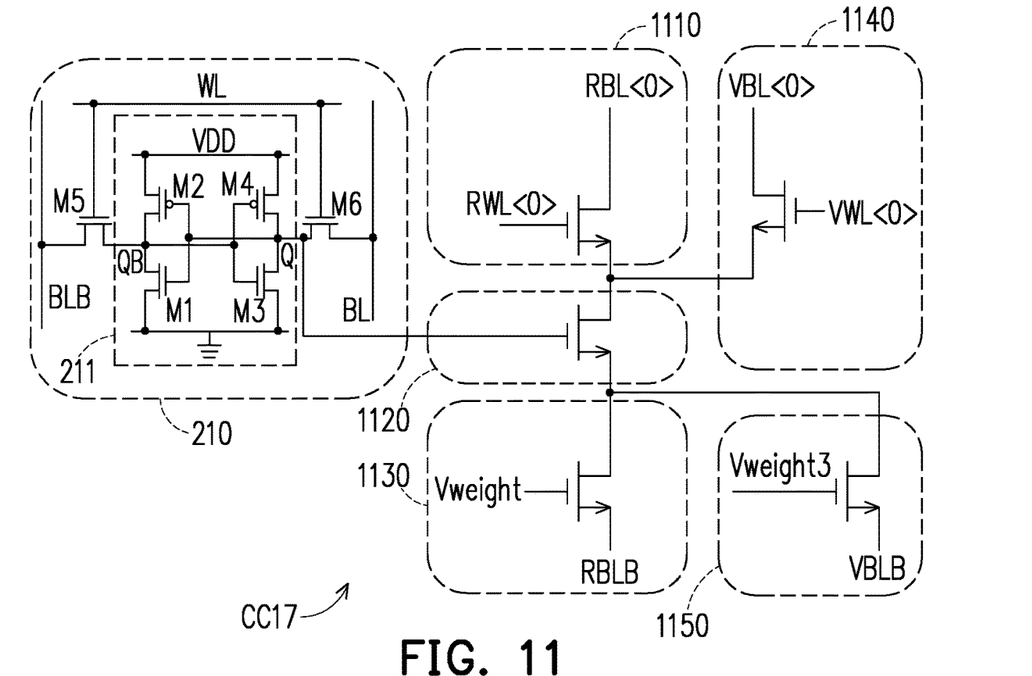
FIG. 11 is a circuit block diagram of the computing in memory cell shown by FIG. 9 according to another embodiment of the disclosure.

FIG. 11 is a circuit block diagram of the computing in memory cell CC17 shown by FIG. 9 according to another embodiment of the disclosure. The other computing in memory cells CC18 to CC32 shown by FIG. 9 can be inferred by referring to the relevant description of the computing in memory cell CC17, which is not repeated hereinafter. In the embodiment shown by FIG. 11, the computing in memory cell CC17 includes a memory cell circuit 210, a semiconductor element 1110, a semiconductor element 1120, a semiconductor element 1130, a semiconductor element 1140, and a semiconductor element 1150. The semiconductor elements 1110, 1120, 1130, 1140, and (or) 1150 may be composed of NMOS transistors, PMOS transistors, or other types of transistors. The memory cell circuit 210 shown by FIG. 11 can be inferred by referring to the relevant description of the memory cell circuit 210 shown by FIG. 2. The semiconductor elements 1110, 1120, 1130, and 1140 shown by FIG. 11 can be analogized with reference to the related description of the semiconductor elements 1010, 1120, 1130, and 1040 shown by FIG. 10, which is not repeated hereinafter.

A first terminal of the semiconductor element 1150 shown by FIG. 11 is coupled to a second terminal of the semiconductor element 1120. A second terminal of the semiconductor element 1150 is adapted to be coupled to a computing bit-line VBLB. According to design requirements, the computing bit-line VBLB can be coupled to a voltage source (not shown) to receive the reference voltage. For instance, the second terminal of the semiconductor element 1150 can receive the ground voltage (or other reference voltage) through the computing bit-line VBLB. A control terminal of the semiconductor element 1150 is adapted to receive a bias voltage Vweight3 corresponding to a weight. The weight and the bias voltage Vweight3 may be determined according to design requirements. A voltage difference between the bias voltage Vweight3 of the control terminal of the semiconductor element 1150 and a voltage of the computing bit-line VBLB is less than a threshold voltage of the semiconductor element 1150.

The sense amplifier SA5 shown by FIG. 9 can provide a voltage (or a current) to the computing bit-line VBL<0>. In the case where both the semiconductor elements 1140 and 1120 are turned on, the semiconductor element 1150 shown by FIG. 11 can provide a weight resistance corresponding to the weight. Based on the setting of the bias voltage Vweight3, the weight resistance of the semiconductor element 1150 may be determined according to design requirements.

Figure 12:
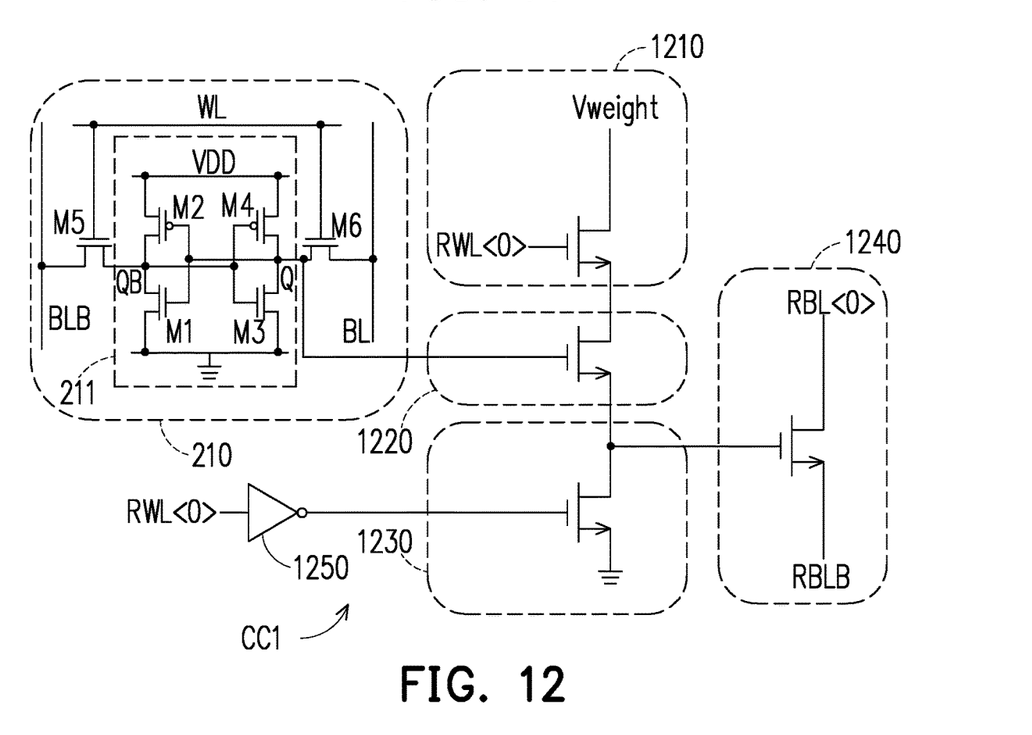
FIG. 12 is a circuit block diagram of the computing in memory cell shown by FIG. 1 according to yet another embodiment of the disclosure.

FIG. 12 is a circuit block diagram of the computing in memory cell CC1 shown by FIG. 1 according to yet another embodiment of the disclosure. The other computing in memory cells CC2 to CC16 shown by FIG. 1 can be inferred by referring to the relevant description of the computing in memory cell CC1, which is not repeated hereinafter. In the embodiment shown by FIG. 12, the computing in memory cell CC1 includes a memory cell circuit 210, a semiconductor element 1210, a semiconductor element 1220, a semiconductor element 1230, a semiconductor element 1240, and a NOT gate 1250. The memory cell circuit 210 shown by FIG. 12 can be inferred by referring to the relevant description of the memory cell circuit 210 shown by FIG. 2, which is not repeated hereinafter.

Referring to FIG. 12, the semiconductor elements 1210, 1220, 1230, and (or) 1240 may be composed of NMOS transistors, PMOS transistors, or other types of transistors. A first terminal of the semiconductor element 1210 is adapted to receive a bias voltage Vweight corresponding to a weight, and a control terminal of the semiconductor element 1210 is adapted to be coupled to the computing word-line RWL<0>. A control terminal of the semiconductor element 1220 is coupled to the data node Q in the memory cell circuit 210. A first terminal of the semiconductor element 1220 is coupled to a second terminal of the semiconductor element 1210. A control terminal of the semiconductor element 1240 is coupled to a second terminal of the semiconductor element 1220. A first terminal of the semiconductor element 1240 is adapted to be coupled to the computing bit-line RBL<0>. A second terminal of the semiconductor element 1240 is adapted to be coupled to the computing bit-line RBLB. According to design requirements, the computing bit-line RBLB can be coupled to a voltage source (not shown) to receive the reference voltage. For instance, the second terminal of the semiconductor element 1240 can receive the ground voltage (or other reference voltage) through the computing bit-line RBLB.

A first terminal of the semiconductor element 1230 is coupled to a second terminal of the semiconductor element 1220. A second terminal of the semiconductor element 1230 is adapted to receive the reference voltage (e.g., the ground voltage or other fix voltages). A control terminal of the semiconductor element 1230 is adapted to receive an inverted signal of the computing word-line RWL<0>. For instance, an input terminal of the NOT gate 1250 is adapted to be coupled to the computing word-line RWL<0>, and an output terminal of the NOT gate 1250 can provide the inverted signal to the control terminal of the semiconductor element 1230. When the computing word-line RWL<0> is at logic "1" (e.g., high logic level), the semiconductor element 1230 is turned off. When the computing word-line RWL<0> is at logic "0" (e.g., low logic level), the semiconductor element 1230 is turned on to discharge the control terminal of the semiconductor element 1240.

In the case where both the semiconductor elements 1210 and 1220 are turned on, the bias voltage Vweight can be transmitted to the control terminal of the semiconductor element 1240. The bias voltage Vweight may be determined according to design requirements. A voltage difference between the bias voltage Vweight of the control terminal of the semiconductor element 1240 and a voltage of the computing bit-line RBLB is less than a threshold voltage of the semiconductor element 1240. Based on the setting of the bias voltage Vweight, the weight resistance of the semiconductor element 1240 may be determined according to design requirements.

In summary, the computing word-lines RWL described in the foregoing embodiments can provide one element (a first data bit for control a first semiconductor element to be turned on/off) in the matrix A, and the memory cell circuit can provide one element (a second data bit for controlling a second semiconductor element to be turned on/off) in the other matrix B. The operation of the first semiconductor element (e.g., 710, 1010, 1110, or 1210) and the second semiconductor element (e.g., 720, 1020, 1120, or 1220) is equivalent to a multiplication operation performed on the first data bit and the second data bit. As a result, the in-memory computing cell can realize in-memory computing.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A computing in memory cell, comprising:
a memory cell circuit;
a first semiconductor element having a first terminal, a second terminal, and a control terminal, wherein the first terminal of the first semiconductor element is adapted to be coupled to a first computing bit-line, and the control terminal of the first semiconductor element is adapted to be coupled to a first computing word-line;
a second semiconductor element having a first terminal, a second terminal, and a control terminal, wherein the control terminal of the second semiconductor element is coupled to a first data node in the memory cell circuit, and the first terminal of the second semiconductor element is coupled to the second terminal of the first semiconductor element; and
a third semiconductor element configured to provide a first weight resistance corresponding to a first weight, wherein a first terminal of the third semiconductor element is coupled to the second terminal of the second semiconductor element, a second terminal of the third semiconductor element is adapted to be coupled to a second computing bit-line, and a control terminal of the third semiconductor element is adapted to receive a first bias voltage corresponding to the first weight.

2. The computing in memory cell of claim 1, wherein the memory cell circuit comprises:
a static random access memory cell having the first data node and a second data node;
a first switch having a first terminal coupled to the first data node, wherein a second terminal of the first switch is adapted to be coupled to a first data bit-line, and a control terminal of the first switch is adapted to be coupled to a data word-line; and
a second switch having a first terminal coupled to the second data node, wherein a second terminal of the second switch is adapted to be coupled to a second data bit-line, and a control terminal of the second switch is adapted to be coupled to the data word-line.

3. The computing in memory cell of claim 2, wherein the static random access memory cell comprises:
a first transistor having a control terminal coupled to the first data node, wherein a first terminal of the first transistor is coupled to the second data node, and a second terminal of the first transistor is adapted to receive a reference voltage;
a second transistor having a control terminal coupled to the first data node, wherein a first terminal of the second transistor is coupled to the second data node, and a second terminal of the second transistor is adapted to receive a system voltage;
a third transistor having a control terminal coupled to the second data node, wherein a first terminal of the third transistor is coupled to the first data node, and a second terminal of the third transistor is adapted to receive the reference voltage; and
a fourth transistor having a control terminal coupled to the second data node, wherein a first terminal of the fourth transistor is coupled to the first data node, and a second terminal of the fourth transistor is adapted to receive the system voltage.

4. The computing in memory cell of claim 1, wherein the first semiconductor element, the second semiconductor element, and the third semiconductor element are all composed of N-channel metal oxide semiconductor transistors.

5. The computing in memory cell of claim 1, further comprising:
a fourth semiconductor element having a first terminal, a second terminal, and a control terminal, wherein the first terminal of the fourth semiconductor element is adapted to be coupled to a third computing bit-line, the second terminal of the fourth semiconductor element is coupled to the first terminal of the second semiconductor element, and the control terminal of the fourth semiconductor element is adapted to be coupled to a second computing word-line.

6. The computing in memory cell of claim 5, wherein a direction of the first computing bit-line is different from a direction of the third computing bit-line, and a direction of the first computing word-line is different from a direction of the second computing word-line.

7. The computing in memory cell of claim 1, further comprising:
   a fourth semiconductor element configured to provide a second weight resistance corresponding to a second weight, wherein a first terminal of the fourth semiconductor element is coupled to the second terminal of the second semiconductor element, a second terminal of the fourth semiconductor element is adapted to be coupled to a third computing bit-line, and a control terminal of the fourth semiconductor element is adapted to receive a second bias voltage corresponding to the second weight.

8. The computing in memory cell of claim 7, wherein a voltage difference between the second bias voltage and a voltage of the third computing bit-line is less than a threshold voltage of the fourth semiconductor element.

9. The computing in memory cell of claim 1, wherein a voltage difference between the first bias voltage and a voltage of the second computing bit-line is less than a threshold voltage of the third semiconductor element.

* * * * *